US012792798B2

(12) United States Patent
Chi et al.

(10) Patent No.: US 12,792,798 B2
(45) Date of Patent: Nov. 10, 2026

(54) SYSTEM FOR MACHINE LEARNING-BASED ACCELERATION OF A TOPOLOGY OPTIMIZATION PROCESS

(71) Applicants: Siemens Aktiengesellschaft, Munich (DE); Georgia Tech Research Corporation, Atlanta, GA (US)

(72) Inventors: Heng Chi, Plainsboro, NJ (US); Yuyu Zhang, Atlanta, GA (US); Tsz Ling Elaine Tang, Plainsboro, NJ (US); Janani Venugopalan, Plainsboro, NJ (US); Lucia Mirabella, Plainsboro, NJ (US); Le Song, Atlanta, GA (US); Glaucio Paulino, Mableton, GA (US)

(73) Assignees: Siemens Aktiengesellschaft, Munich (DE); Georgia Tech Research Corporation, Atlanta, GA (US)

( * ) Notice: Subject to any disclaimer, the term of this patent is extended or adjusted under 35 U.S.C. 154(b) by 1084 days.

(21) Appl. No.: 17/422,282

(22) PCT Filed: Jan. 29, 2020

(86) PCT No.: PCT/US2020/015600

§ 371 (c)(1),
(2) Date: Jul. 12, 2021

(87) PCT Pub. No.: WO2020/160099

PCT Pub. Date: Aug. 6, 2020

(65) Prior Publication Data

US 2022/0092240 A1 Mar. 24, 2022

Related U.S. Application Data

(60) Provisional application No. 62/798,153, filed on Jan. 29, 2019.

(51) Int. Cl.
*G06F 30/27* (2020.01)
*G06F 30/17* (2020.01)
(Continued)

(52) U.S. Cl.
CPC .............. *G06F 30/27* (2020.01); *G06F 30/17* (2020.01); *G06F 30/23* (2020.01); *G06N 20/00* (2019.01)

(58) Field of Classification Search
CPC .......... G06F 30/27; G06F 30/17; G06F 30/23; G06N 20/00
See application file for complete search history.

(56) References Cited

U.S. PATENT DOCUMENTS

| | | | | |
|---|---|---|---|---|
| 2014/0214370 A1* | 7/2014 | Olhofer | G06F 30/00 | 703/1 |
| 2015/0278706 A1* | 10/2015 | Shivashankar | G06N 20/00 | 706/12 |

(Continued)

OTHER PUBLICATIONS

Bourdin, Blaise. "Filters in topology optimization." International journal for numerical methods in engineering 50.9 (2001): 2143-2158. (Year: 2001).*

(Continued)

*Primary Examiner* — Michelle T Bechtold
*Assistant Examiner* — Nicholas S Wu

(57) ABSTRACT

A system and method for accelerating topology optimization of a design includes a topology optimization module configured to determine state variables of the topology using a two-scale topology optimization using design variables for a coarse-scale mesh and a fine-scale mesh for a number of optimization steps. A machine learning module includes a fully connected deep neural network having a tunable number of hidden layers configured to execute an initial training of a machine learning-based model using the history data, determine a predicted sensitivity value related to the design variables using the trained machine learning model, execute an online update of the machine learning-based model using updated history data, and update the design variables based on the predicted sensitivity value. The model predictions reduce the number of two-scale optimizations for each optimization step to occur only for initial training and for online model updates.

14 Claims, 7 Drawing Sheets

(51) Int. Cl.
*G06F 30/23* (2020.01)
*G06N 20/00* (2019.01)

(56) References Cited

U.S. PATENT DOCUMENTS

| | | | | |
|---|---|---|---|---|
| 2017/0343984 | A1* | 11/2017 | Czinger | B33Y 50/00 |
| 2019/0056715 | A1* | 2/2019 | Subramaniyan | G06N 7/01 |
| 2020/0143009 | A1* | 5/2020 | Schmidt | G06F 30/17 |

OTHER PUBLICATIONS

Nguyen, Tam H., et al. "A computational paradigm for multiresolution topology optimization (MTOP)." Structural and Multidisciplinary Optimization 41 (2010): 525-539. (Year: 2010).*

Banga S, Gehani H, Bhilare S, Patel S, Kara L. 3D topology optimization using convolutional neural networks. arXiv preprint arXiv: 1808.07440. Aug. 22, 2018. (Year: 2018).*

Papadrakakis, Manolis, Nikos D. Lagaros, and Yiannis Tsompanakis. "Structural optimization using evolution strategies and neural networks." Computer methods in applied mechanics and engineering 156.1-4 (1998): 309-333. (Year: 1998).*

Yadav, Sangeeta, K. K. Pathak, and Rajesh Shrivastava. "Shape Optimization of Cantilever Beams Using Neural Network." Applied Mathematical Sciences 4.32 (2010): 1563-1572. (Year: 2010).*

Langelaar, Matthijs. "Combined optimization of part topology, support structure layout and build orientation for additive manufacturing." Structural and Multidisciplinary Optimization 57.5 (2018): 1985-2004. (Year: 2018).*

Y. Zhang et al: "A deep Convolutional Neural Network for topology optimization with strong generalization ability", arxiv.org, Cornell University Library, 2010 Lin Library Cornell University Ithaca, NY 14853, Jan. 23, 2019 (Jan. 23, 2019), XP081007102 / Jan. 23, 2019.

T. H. Nguyen et al: "A computational paradigm for muitiresolution topology optimization (mT0p)", Structural and Multidisciplinary Optimization, . 41, No. 4, Nov. 12, 2009 (Nov. 12, 2009), pp. 525-539, XP019797566 / Nov. 12, 2009.

International Search Report dated May 19, 2020; Application No. PCT/US2020/015600; 12 pages.

* cited by examiner

SYSTEM FOR MACHINE LEARNING-BASED ACCELERATION OF A TOPOLOGY OPTIMIZATION PROCESS

This application is a national phase filing under 35 U.S.C. § 371 of International Patent Application No. PCT/US2020/015600, filed Jan. 29, 2020, which claims the benefit of priority to U.S. Provisional Patent Application Ser. No. 62/798,153, filed Jan. 29, 2019, which are incorporated herein by reference in their entirety.

TECHNICAL FIELD

This application relates to topology optimization useful for engineering shapes of material in the context of withstanding various operating conditions. More particularly, this application relates to machine learning-based acceleration of a topology optimization process.

BACKGROUND

Topology Optimization has gained a lot of interest in engineering for its ability of generating automatically innovative shapes, such as in the field of additive manufacturing, that can withstand the operating conditions typical of the context in which the engineering component is utilized, while optimizing on one or more objectives. However, the traditional approach to perform topology optimization is computationally very expensive, as it requires solving a multi-physics problem multiple times to evaluate both the physics variables and sensitivity during the optimization cycle. Finite elements analysis (FEA), which is based on the finite element method (FEM), it is a technique that makes use of computers to predict the behavior of varied types of physical systems such as deformation of solids, heat conduction and fluid flow. Geometry of an object is defined by elements of a mesh and analyzed for external influences (i.e., boundary conditions).

Parallel computing or graphical processing unit (GPU) based programming are sometimes employed for topology optimization to reduce the generation time of one optimized design. Some other approaches have been found in the literature that try to use past data acquired during past runs of the topology optimization study to speed up a new instance of the same topology optimization case. However, such approaches have limited applicability as the information learned from past cases are not likely to transfer to new optimization cases which may vastly differ with the past ones.

SUMMARY

A system and method for accelerating topology optimization of a design includes a topology optimization module configured to determine state variables of the topology using a two-scale topology optimization using design variables for a coarse-scale mesh and a fine-scale mesh for a number of optimization steps. A machine learning module includes a fully connected deep neural network having a tunable number of hidden layers configured to execute an initial training of a machine learning-based model using the history data, determine a predicted sensitivity value related to the design variables using the trained machine learning model, execute an online update of the machine learning-based model using updated history data, and update the design variables based on the predicted sensitivity value. The model predictions reduce the number of two-scale optimizations for each optimization step to occur only for initial training and for online model updates.

BRIEF DESCRIPTION OF THE DRAWINGS

Non-limiting and non-exhaustive embodiments of the present embodiments are described with reference to the following FIGURES, wherein like reference numerals refer to like elements throughout the drawings unless otherwise specified.

DETAILED DESCRIPTION

Figure 1:
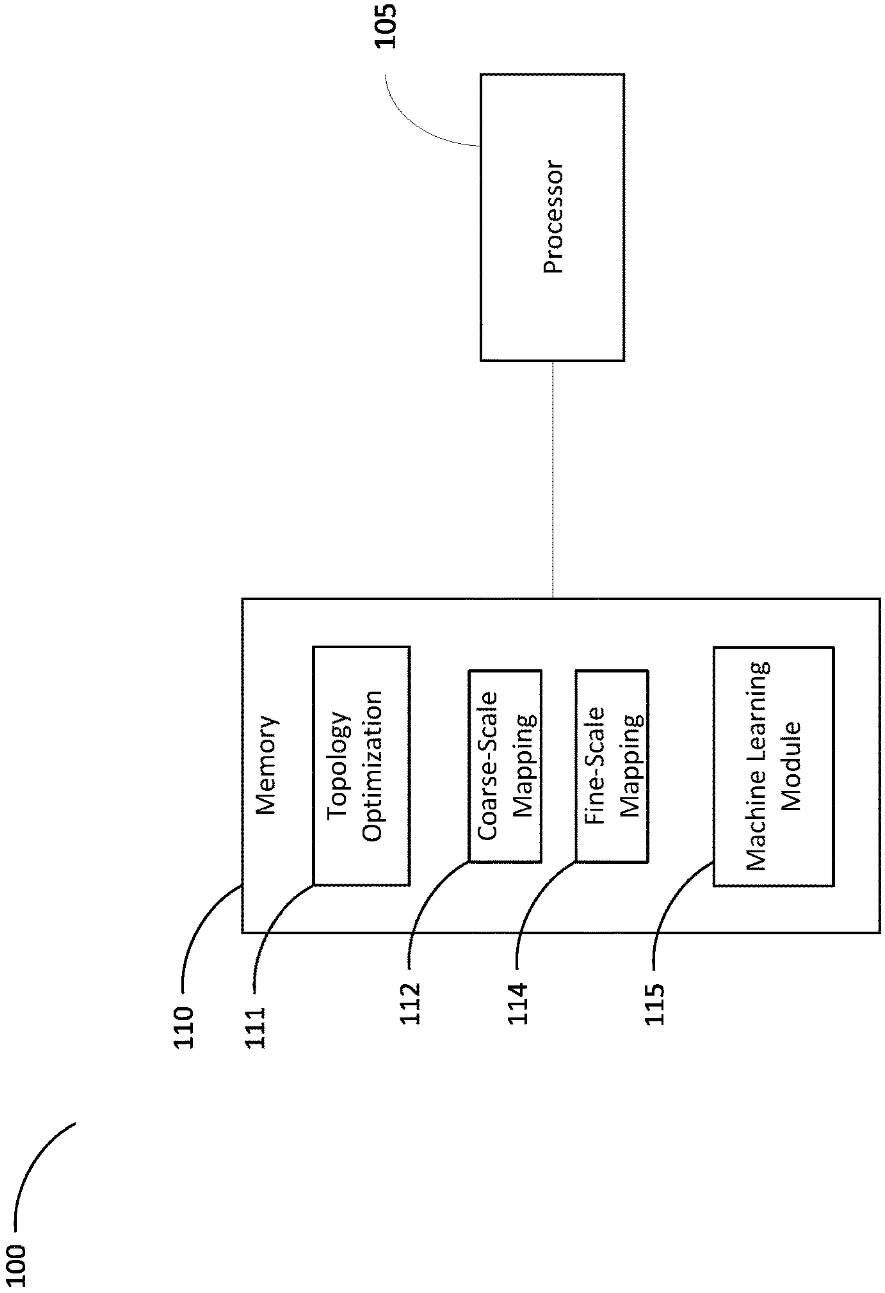
FIG. 1 is a block diagram for an example of a system for accelerated simulation setup in accordance with embodiments of the disclosure.

Methods and systems are disclosed for a topology optimization process enhanced by an algorithm that learns from a current iteration of the topology optimization process rather than relying on past data. A machine learning-based topology optimization framework provides a general approach which greatly accelerates the design process of large-scale problems in 3D. The machine-learning based model is trained using the history data of topology optimization, which data may be collected during topology optimization and, therefore, does not require a separate stage for collecting samples to train machine learning-based models. Thus, the training occurs in real time during the topology optimization process rather than prior to it. The proposed framework adopts a tailored two-scale topology optimization formulation and introduces a localized training strategy. The localized training strategy can improve both the scalability and accuracy of the proposed framework. The proposed framework incorporates an online update scheme which continuously improves the accuracy of the machine learning module (or surrogate) by updating based on new data generated from physical simulations. Implementation of such a framework for topology optimization results in reduction of computational costs and significant time savings, particularly evident for large-scale and multi-physics (e.g. thermal-flow) problems.

A topology optimization formulation for the classical compliance-minimization problem is briefly described as follows. Herein, it is assumed that the design domain is discretized by a finite element mesh and a standard density-based approach is adopted, where the material distribution is characterized by an element-wise constant function.

An objective is to find the structural topology which has the most stiffness under a prescribed load and boundary conditions (i.e., least possible displacement for the given boundary conditions under the prescribed load). For example, multi-variable analysis for optimizing the topology may involve balancing a variable displacement of points on a designed body to measure stiffness against a volume constraint that minimizes the material cost to construct the designed body. In other words, a preferred design may have significant voids to minimize material while not sacrificing too much stiffness necessary to support the design load. Global measure of displacements is the "compliance", or strain energy, of the structure. For a given finite element mesh with N nodes and M elements, the applied global force vector is denoted as $f \in \mathbb{R}^{dN\times 1}$. The vector of design variables z, whose ith component $z_i$ is the design variable associated with the ith element. Within this setting, an objective for topology optimization is to minimize compliance and can be expressed by the following:

$$\begin{aligned} &\min_z \; c(z) = f^\top u(z) \\ &\text{s.t. } gv(z) = v^\top \bar{z} - V_{max} \le 0 \\ &0 \le 1 \;\forall\, i \in \{1, \ldots, M\} \\ &\text{with } K(z)u(z) = f \text{ and } \bar{z} = Pz, \end{aligned} \tag{1}$$

where: c(z) is the compliance function, $u(z) \in \mathbb{R}$^(dN×1) is the global displacement vector, v is a vector whose ith component $v_i$ is the volume of element i, gv is a volume constraint function, $\bar{z}$ is a filtered design variable vector, P is the density filter matrix, K is the global stiffness matrix, and $V_{max}$ is the maximum allowable volume imposed on the design.

To ensure the well-posedness of the formulation and impose a minimum length scale on the design, the filtered design variable vector $\bar{z}$ is used, where P is the density filter matrix whose (i,j)th component is given by:

$$(P)_{ij} = \frac{\max(0, R - |x_i^* - x_j^*|)}{\sum_{k\in S(j)} (R - |x_k^* - x_j^*|)}, \tag{2}$$

where R is the radius of the density filter, S(j) denotes the set of indices of elements whose centroids fall within radius R of the centroid of the jth element, and $$x_i^*$$

and $$x_j^*$$

stand for the centroid of the ith and jth elements, respectively.

The standard Solid Isotropic Microstructures with Penalization (SIMP) scheme is adopted to penalize the intermediate densities throughout. In the SIMP scheme, the global stiffness matrix K is interpolated as:

$$K(z) = \bigcup_j E_j k_j^0 \tag{3}$$

where:

$$k_j^0$$

is the element stiffness matrix for the jth element when the material is solid,

∪ represents the standard assembly procedure in the finite element method (FEM), and $E_j$ is interpolated stiffness of element j normalized by the Young's modulus of the solid material given by:

$$E_j = E_{min} + (1 + E_{min})(\bar{z})^p \tag{4}$$

where: $E_{min}$ is Ersatz stiffness (e.g., $10^{-4}$), and p is the SIMP penalization parameter (e.g., p=3). The sensitivity information is needed to perform the design variable update. Sensitivity vector G with respect to vector z, and sensitivity vector $\bar{G}$ for filtered design variable vector $\bar{z}$ is computed by the following equations:

$$\bar{G}_i = \frac{\partial c}{\partial \bar{z}_i} = -p(\bar{z}_i)^{p-1}(u_i)^\top k_j^0 u_i, \tag{5}$$

$$G = P^\top \bar{G}. \tag{6}$$

where $u_i$ the displacement vector of the ith element.

In contrast, the sensitivity of the volume constraint function gv is simply given by the following:

$$\frac{\partial_{gv}}{\partial z} = P^\top v. \tag{7}$$

Once the sensitivities of both the objective and constraint functions are obtained, a Modified Optimality Criteria (MOC) method (e.g., as proposed by Ma et al., 1993) is applied to update the design variables. The MOC design update algorithm is able to handle sensitivities with positive values, which could potentially occur in the machine learning-based framework of this disclosure. It should be noted that the proposed machine learning-based framework also works with any gradient-based design update scheme (e.g., the Method of Moving Asymptotes (MMA) by Svanberg, 1987). For a design variable vector z(k) at the optimization step k, the MOC method updates the design variable vector for the optimization step k+1 as follows:

$$z_i^{(k+1)} = \begin{cases} \max\left(z_{min}, z_i^{(k)} - m\right) & \text{if } z_i^{(k)}\left(B_i^{(k)}\right)^\eta \le \max\left(z_{min}, z_i^{(k)} - m\right) \\ \min\left(1, z_i^{(k)} + m\right) & \text{if } \min\left(1, z_i^{(k)} + m\right) \le z_i^{(k)}\left(B_i^{(k)}\right)^\eta \\ z_i^{(k)}\left(B_i^{(k)}\right)^\eta & \text{otherwise} \end{cases}, \tag{8}$$

where m is the move limit and η is the damping coefficient. The coefficient $$B_i^{(k)}$$

is given by:

$$B_i^{(k)} = \frac{\mu}{\Lambda} - \frac{G_i(z^{(k)})}{[\sum_j (P)_{ji} v_j]\Lambda}, \quad (9)$$

where μ is a shift parameter taken to be the maximum value of positive sensitivities, given by the following:

$$\mu = \max\left(0, \max_i\left(\frac{G_i(z^{(k)})}{\sum_j (P)_{ji} v_j}\right)\right), \quad (10)$$

and where Λ>0 is the Lagrangian multiplier found using a bisection algorithm (e.g., Bendsoe and Sigmund, 2013) such that the volume constraint function gv $(z^{(k+1)})=0$ is satisfied.

FIG. 1 shows a block diagram of a topology optimization system in accordance with embodiments of this disclosure. In an embodiment, topology optimization system 100 includes a processor 105 and memory 110 on which is stored a topology optimization module 111 and a machine learning module 115. To execute a two-scale topology optimization, a coarse scale mapping module 112 and fine scale mapping module 114 generate coarse-scale and fine-scale mapping of topology elements useful for solving state equations when performing nodal displacement analyses on a test model for the topology design. The topology optimization system 100 synergistically integrates machine learning with topology optimization to achieve accelerated and improved designs. Using an iterative process involving hundreds of steps, the topology optimization is performed where for each new design, the structural response of the current design needs to be solved to compute the sensitivity of the objective function. For large-scale topology optimization, this procedure is computationally intensive.

A large amount of historical data (e.g., design variables, their corresponding sensitivities, and displacement solutions) is generated during topology optimization, but typically, not all of the historical data is fully explored and used. In view of this, a universal machine learning approach is proposed herein to learn the mapping between the current design and their corresponding sensitivities from historical data. Once the machine learning model is trained, it can be employed in the later optimization steps to directly predict the sensitivities based on the current design without solving the state equations.

The training of the machine learning module 115 consists of two stages: an initial training stage and several online update stages. To control when to start each stage, parameters for initial training step $N_I$ and online update frequency $N_F$ are introduced. Additionally, to control the amount of history data used in training, parameters are introduced for window size $W_I$ for steps of initial training and window size $W_U$ for steps of an online update. As for the machine learning-based model, a fully-connected Deep Neural Network (DNN) may be employed for machine learning module 115. Other machine learning-based models, such as the Convolutional Neural Network (CNN), can also be adopted by the machine learning module 115.

For initial training of the machine learning module 115, the optimization starts with a standard finite element analysis (e.g., solving the state equation and computing the sensitivity based on Eq. (6)) in the first $N_I+W_I-1$ optimization steps, and collect the history data from the last $W_I$ steps (i.e. step $N_I$ to step $N_I+W_I-1$) to initially train a machine learning-based model. In an aspect, data can be discarded from step 1 to step $N_I-1$ because for a small initial set of iterations, results generally have significant variations and are biased to the initial guess. Subsequently, starting from optimization step $N_I+W_I$, instead of following the standard finite element analysis, the trained machine learning-based model is applied to directly predict the sensitivities. By doing this, the computationally expensive task of solving the state equations and computing the sensitivities can be avoided.

To improve accuracy of the predicted sensitivity in the long term by machine learning module 115, the machine learning-based model is repeatedly updated online by periodically switching back to the standard finite element analysis for one optimization step to generate new data. The parameter $N_F$ is used to control the frequency of the online update, meaning that the online update is performed every $N_F$ optimization steps after the initial prediction step ($N_I+W_I$). In the online update of the machine learning-based model, the data is collected from standard finite element analysis of previous steps for a defined window size $W_U$.

Figure 2:
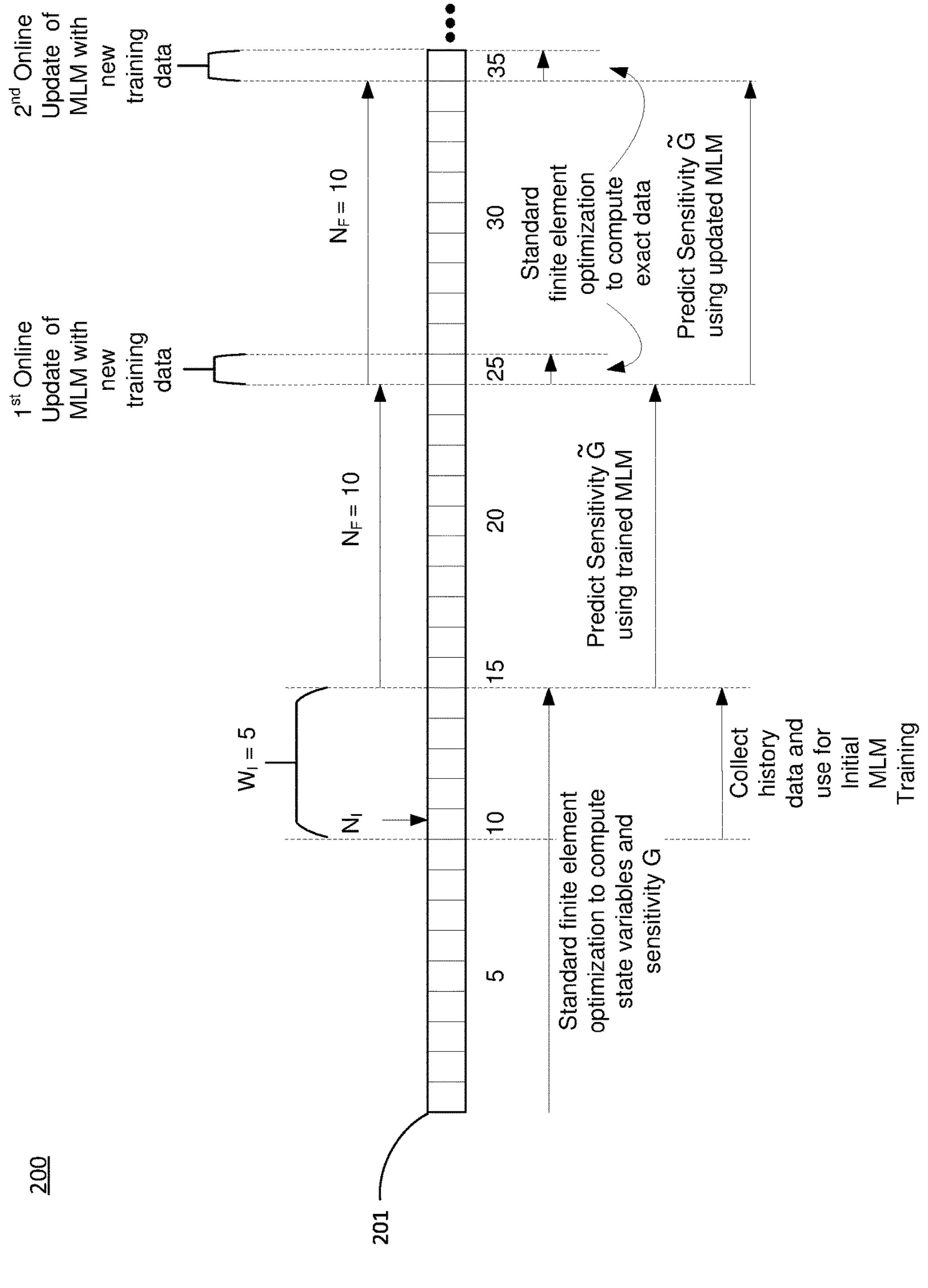
FIG. 2 illustrates an example of a method for accelerated simulation setup in accordance with embodiments of the disclosure.

FIG. 2 is an illustration of an example of the integrated topology optimization and machine learning process in accordance embodiments of this disclosure. A set of topology optimization steps 201 are shown, where update parameter selections include initial training step $N_I=10$, initial training window size $W_I=5$, update frequency $N_F=10$ and update window size $W_U=2$. Accordingly, the optimization starts with the standard finite element analysis optimization procedure in the first 14 steps and uses the data generated from step 10 to step 14 to train the machine learning-based model. Starting from optimization step 15, the machine learning-based model is used to predict the sensitivity. Because the online update frequency is $N_F=10$, the process switches back to the standard finite element analysis optimization procedure at optimization step 25 to generate new data for one step. Based on setting window $W_U=2$, the data in optimization steps 14 and 25 generated by standard finite element analysis optimization are used as the input for a first online update the machine learning-based model, which are the last two steps in which finite element analysis data was retrieved. As alternative illustrative example for $W_U=5$, then data from steps 11-14 and 25 would be used for the update, being the last five steps in which finite element analysis data was generated and obtained. The updated machine learning-based model is used to predict the sensitivity in the following steps and to recursively update the model every 10 steps (according with update frequency $N_F=10$) until either the convergence criteria are fulfilled, or the maximum allowable step is reached. As shown in FIG. 2, the $2^{nd}$ online update occurs at step 35, using standard finite element analysis data from steps 25 and 35 to update the machine learning-based model.

In an embodiment, a two-scale topology optimization setup, a coarse-scale and a fine-scale, is applied to the topology optimization framework. This allows full use of the local information in the historical data and ensures that the machine learning-based model is both scalable and able to make accurate sensitivity predictions. On the fine-scale mesh, all the design variable updates are performed for every optimization step but only solve the state equations in those steps that collect the training data. On the other hand, no design variable update is performed on the coarse-scale mesh, but the state equation is solved at every optimization step based on the stiffness distribution mapped from fine-scale mesh. Strain information on the coarse-scale mesh, together with the filtered design variables on the fine-scale mesh, are used as inputs to the machine learning-based model. Algorithm 1, below, summarizes the topology optimization described above.

Algorithm 1: Proposed framework of universal machine learning for topology optimization.

```
Input: z^(0), V_max, R, T ol, Iter_max, N_I, N_F, W_I and W_U;
Form filter matrix P:
for k = 0 to Iter_max do
 | Solve the state equation on coarse-scale mesh;
 | if k < N_I + W_I or mod(max(k − N_I − W_I, 1), N_F) = 0 then
 | | Solve the state equation on fine-scale mesh;
 | | Evaluate sensitivities \bar{G} and G based on (5) and (6);
 | | Store history data;
 | | in k = N_I + W_I − 1 then
 | | | Initial training of the machine learning model using last W_I step of collected data;
 | | else if mod(max(k − N_I − W_I, 1) N_F) = 0 then
 | | | Perform online update of the machine learning model using last W_U step of collected
 | | | data;
 | | end
 | else
 | | Use the machine learning model to predict \bar{\tilde{G}};
 | | Compute the predicted sensitivity as \tilde{G} = P^T \bar{\tilde{G}};
 | end
 | Update z^(k + 1) using (8) based on either G or \tilde{G};
end
if ||z^(k +1) − z^(k)||_∞ ≤ T ol then
 | Output: optimization converged and plot final design;
end
```

In embodiments of this disclosure, machine learning module 115 employs fully-connected Deep Neural Networks (DNNs) as the universal function approximator that takes the input from the two-scale topology optimization module 111 and predicts the sensitivities of the compliance function. The topology optimization system 100 is independent of any specific implementation of the machine learning module 115. Thus, other machine learning-based models, such as Convolutional Neural Networks (CNNs) and Residual Networks (ResNets), as well as their variants like the Densely Connected Convolutional Networks (DenseNets) can be directly applied in the proposed framework.

Figure 3:
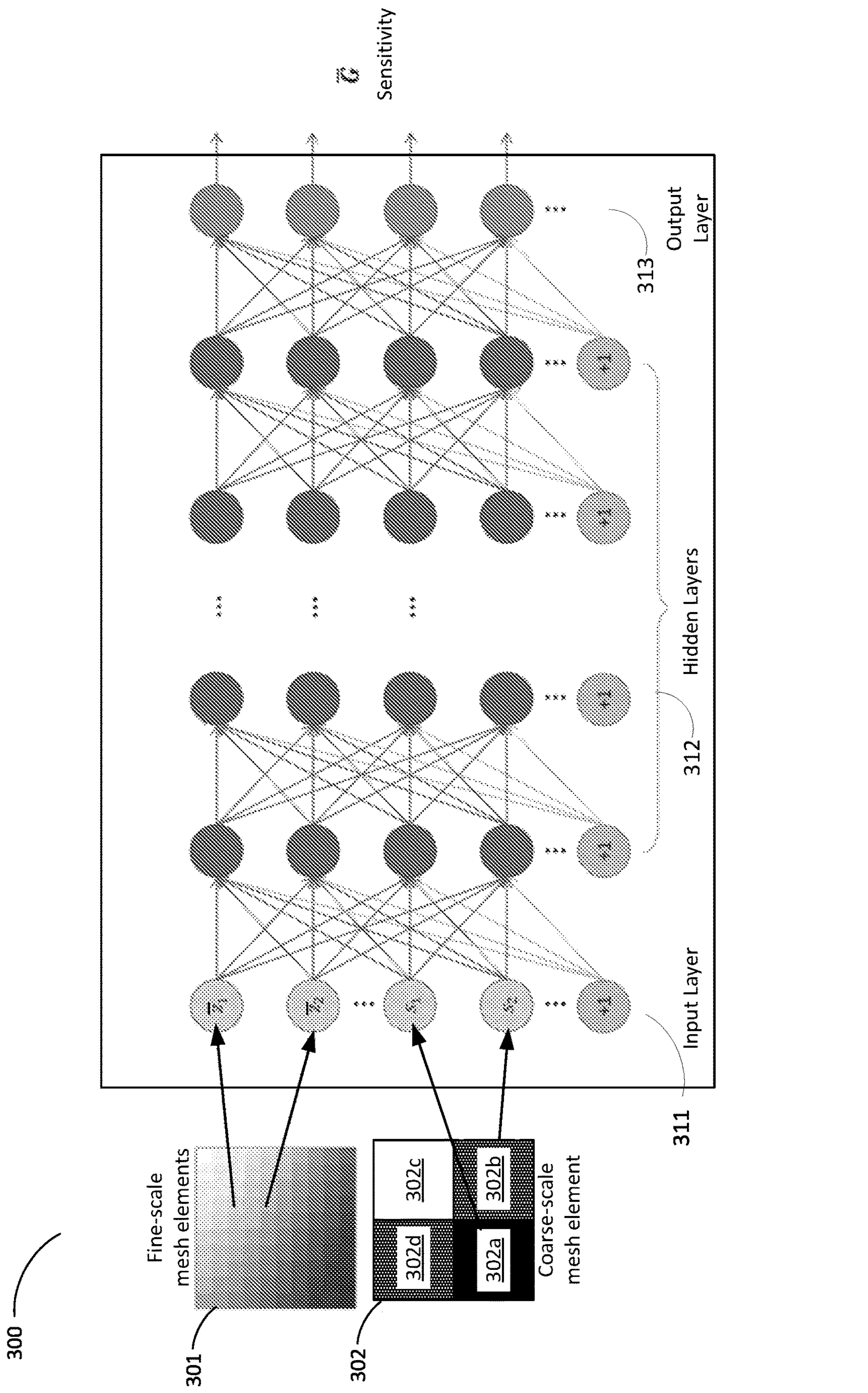
FIG. 3 shows an example architecture of a fully connected DNN model according to embodiments of this disclosure.

FIG. 3 shows an example architecture of a fully connected DNN model according to embodiments of this disclosure. In an embodiment, the DNN model consists of one input layer 311, multiple hidden layers 312, and one output layer 313. Each hidden layer has a set of neurons, each of which takes an input value and performs a non-linear activation to generate its output value. The number of hidden layers 312 is a hyper-parameter and can be tuned according to the trade-off between the computational complexity and model accuracy. Let us denote $N_h$ as the total number of hidden layers 312 in the DNN model. During prediction, each hidden layer takes the output of previous adjacent layer as input, and performs feed-forward computation as follows:

$$h_i=\sigma(W_i h_{i-1}+b_i, i=\{1, \ldots, N\} \tag{11}$$

where $h_i$ is the output of the ith hidden layer;

Wi is the weight vector;

bi is the bias of the ith layer that can be randomly initialized and then optimized during model training; and $\sigma(\cdot)$ is a non-linear activation function.

By convention, $h_0$ designates the input of the input layer 311, which is taken to be a vector collecting the filtered design variables $\bar{z}_i$ from the fine-scale mesh 301 and strain vectors from the coarse-scale mesh 302. Coarse-scale mapping module 112 generates the coarse-scale mesh 302 based on fine-scale mesh 301, which is generated by fine-scale mapping module 114. For example, fine-scale elements 301 are mapped to coarse-scale mesh element 302 divided into sectors 302$a$, 302$b$, 302$c$, 302$d$ according to shading of corresponding quadrant clusters of the fine-scale mesh elements 301, where the shading represents state variable values (e.g., strain) computed by the topology optimization module 111 for the current optimization step. The output layer 313 is obtained by applying a linear transformation of the output of the last hidden layer as:

$$y=W_{out} h_N \tag{12}$$

where $W_{out}$ is also a weight matrix, which will also be learned according to the training data. Herein, the output y is chosen as the sensitivity of the compliance with respected to the filtered design variables. In an aspect, a Parametric Rectified Linear Unit (PReLU) is used as the activation function, which generalizes the traditional rectified unit and is shown to achieve impressive performance on image classification tasks. The PReLU activation function is defined as follows:

$$\sigma(x)=\max(0,x)+a^*\min(0,x) \tag{13}$$

where: a is a learnable parameter, and x is the input of each neuron in the DNN.

To train the DNN model, the training data is collected from full finite element evaluations in the topology optimization as the supervision signal. In an embodiment, an Adam optimization algorithm is used during the training for stochastic gradient-based optimization. In the initial training, all the learnable parameters in the DNN are randomly initialized. In each subsequent online update, the optimized parameters are taken from the last training step as an initial estimation and are updated based on the new training data received.

The proposed integrated framework of this disclosure achieves both accuracy and scalability so that it can be efficiently applied to design problems of any size. Instead of applying brute force to the machine learning-based model to learn the mapping between the filtered design variables and their corresponding sensitivities, the topology optimization formulations are tailored to make best use of the data generated in its history.

According to Equations (5) and (6), the sensitivity of each element depends on both the design variable and the state variables (e.g., nodal displacements) of that element. However, the information about the state variables of each element is not available unless the state equation is solved. In order to provide sufficient information to the machine learning-based model and, at the same time, avoid the most time-consuming step of solving the state equation, a topology optimization formulation with two discretization levels is introduced herein: a coarse-scale mesh and a fine-scale mesh. As mentioned, the design variables z (and the corresponding filtered design variables $\bar{z}$) live on the fine-scale discretization and are updated every optimization step. However, on the fine-scale mesh, the state equations are only solved in those optimization steps when collecting training data for the machine learning-based model. One the contrary, on the coarse-scale mesh, no optimization is performed, but the state equation is solved at every optimization step to provide information about state variables to be fed to the machine learning-based model.

Figure 4:
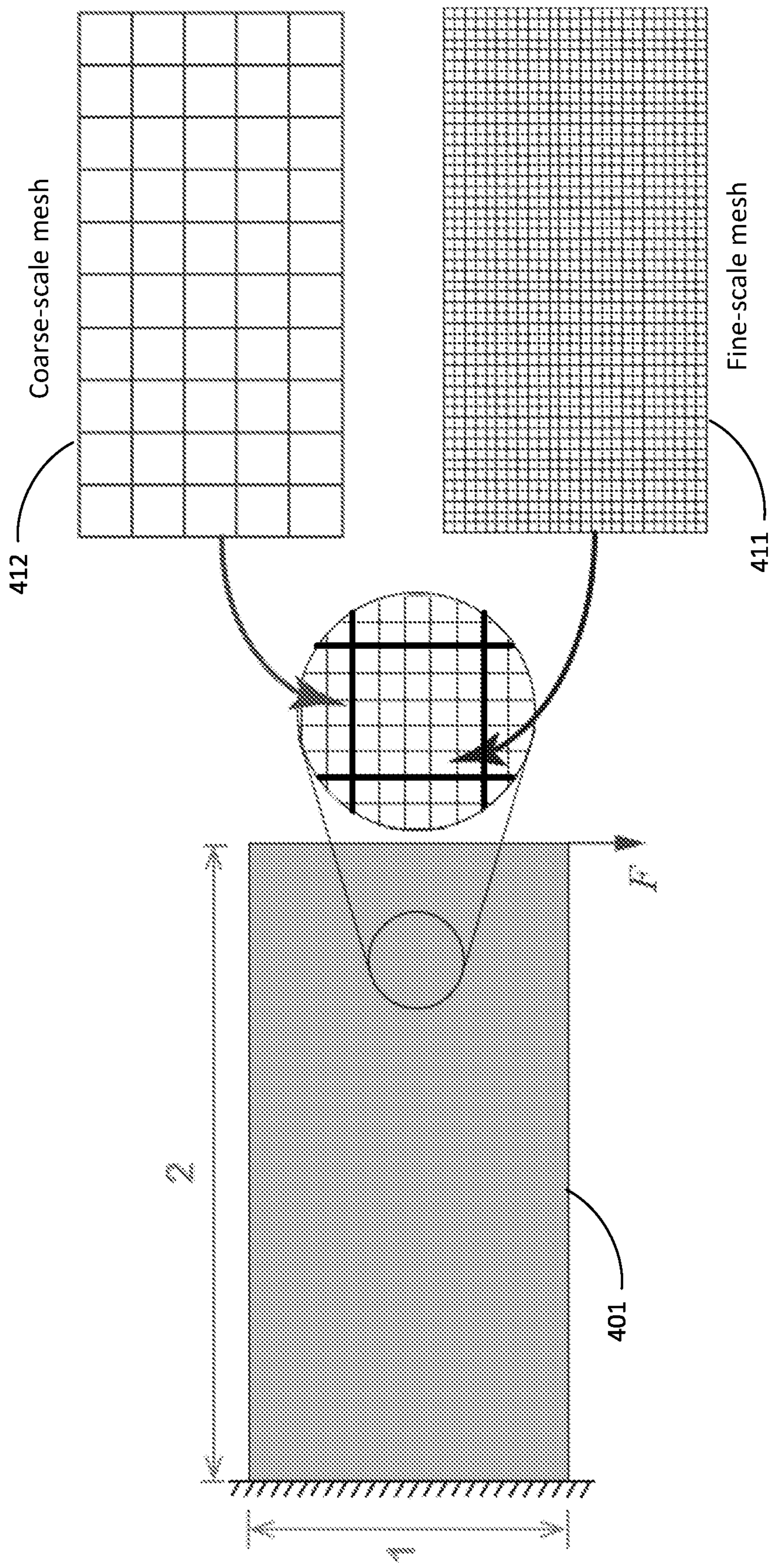
FIG. 4 illustrates an example of coarse-scale and fine-scale meshes for a cantilever beam design problem.

FIG. 4 illustrates an example of coarse-scale and fine-scale meshes for a cantilever beam design problem. Although FIG. 4 depicts a 2D illustration, all numerical examples presented herein focus on 3D problems. Topology of a 3D cantilever beam 401 is represented by coarse-scale mesh 412 and fine-scale mesh 411, each comprising regular hexahedral (brick) finite elements with linear displacement interpolations and it is assumed that the fine-scale mesh 411 is fully embedded in the coarse-scale mesh 412. Under this assumption and because of the regularity of the two meshes 411, 412, every element in the coarse-scale mesh 412 contains the same number of elements in the fine-scale mesh 411. Accordingly, block size NB is a defined parameter that quantifies how many fine-scale elements are contained on each side of a coarse-scale mesh element. For example, the illustration in FIG. 4 has a block size of NB=5, meaning every element in the coarse-scale mesh 412 constrains 5×5=25 elements of fine-scale mesh 411.

Figure 5:
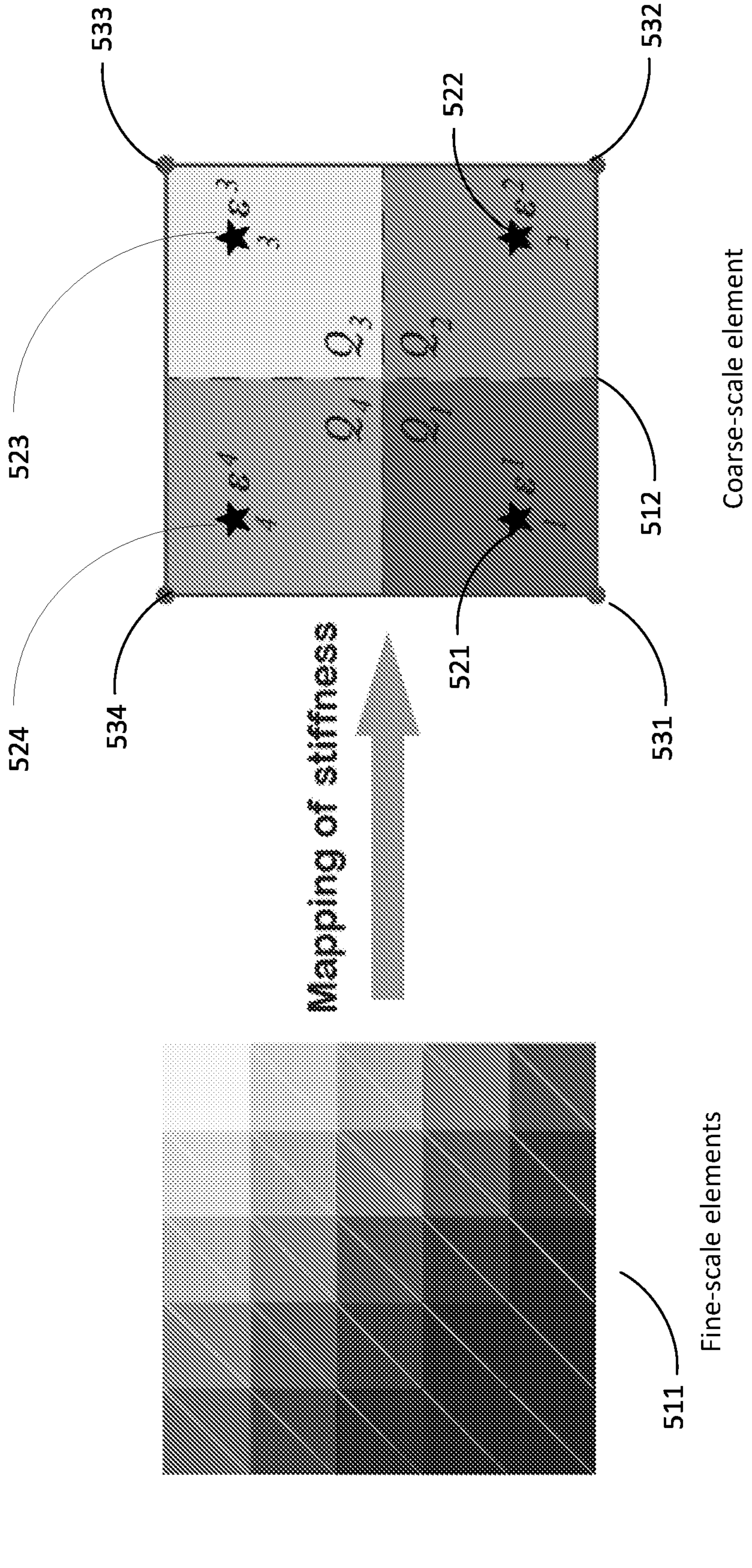
FIG. 5 illustrates a mapping of fine-scale elements to a coarse-scale element in accordance with embodiments of the disclosure.

FIG. 5 illustrates a mapping of fine-scale elements to a coarse-scale element in accordance with embodiments of the disclosure. Because the design update is only performed on the fine-scale mesh, the stiffness distribution of the fine-scale mesh is mapped to the coarse-scale mesh at every optimization step. As an example of mapping, a 5×5 portion of fine scale elements 511 are shown in FIG. 5 to be mapped to a single coarse-scale element 512. This mapping process can be repeated to map the entire array of fine-scale mesh elements of the topology to respective coarse scale elements. The mapping is defined in the following manner. For a given coarse-scale finite element 512 with nodes 531, 532, 533, 534 and a total of $n_G$ integration Gauss points 521, 522, 523, 524, the coarse-scale finite element 512 is divided into a total of $n_G$ sub-regions and each sub-region is associated with one of its integration Gauss points 521, 522, 523, 524. Herein, for a 2D analysis, $n_G$=4 as shown in FIG. 5, and for a 3D analysis, $n_G$=8. In addition, for coarse-scale finite element k, each sub-region $$Q_j^k$$

(j=1, . . . , 4 in 2D, or j=1, . . . , 8 in 3D) is associated with the jth Gauss point. Under this convention, the mapped stiffness at the jth integration point of coarse-scale element k, which is denoted as $$E_j^{C,k},$$

is computed as the weighted average of the interpolated stiffness of all the fine-scale elements that fall within in the sub-region $$Q_j^k,$$

namely, $$E_j^{C,k} = \frac{1}{\sum_{i \in Q_j^k} w_i^{Q_j^k}} \sum_{i \in Q_j^k} w_i^{Q_j^k} E_i, \tag{14}$$

where $E_i$ is the interpolated stiffness of element i in the fine-scale mesh, and $$w_i^{Q_j^k}$$

is the weight assigned to $E_i$ in sub-region $$Q_j^k.$$

If element i in the fine-scale mesh falls completely within $$Q_j^k,$$

then the weight is taken to be $$w_i^{Q_j^k} = 1.$$

Otherwise, if element i falls into a total of n sub-regions, the weight is taken to be $$w_i^{Q_j^k} = \frac{1}{n}$$

for all sub-regions $$Q_j^k.$$

With the stiffness mapping and assuming that all coarse-scale elements are identical, the global stiffness matrix $K^C$ on the coarse-scale mesh is computed as:

$$K^C = \bigcup_k \left[ \sum_{j=1}^{n_G} E_j^{C,k} (B_j^C)^\top D_0 B_j^C J_j^C \right], \tag{15}$$

where $D_0$ is the constitutive matrix of the solid phase, and $$B_j^C$$

and $$J_j^C$$

are the strain-displacement matrix and the Jacobian of iso-parametric mapping at the jth integration point of a coarse-scale element, respectively. The nodal displacement vector $u^C$ of the coarse-scale mesh can then be obtained by solving the state equation as $$u^C=(K^C)^{-1}f^C, \tag{16}$$

where $f^C$ is the applied force vector on the coarse-scale mesh.

Next described are embodiments for integration of the machine learning module and two-scale topology optimization. To promote a more scalable framework, a localized training strategy is applied for the machine learning-based model which capitalizes the main features of the two-scale topology optimization formulation. Instead of treating each global design as an individual training sample, each element is viewed in the coarse-scale mesh together with its enclosed fine-scale elements as an independent training instance.

Figure 6:
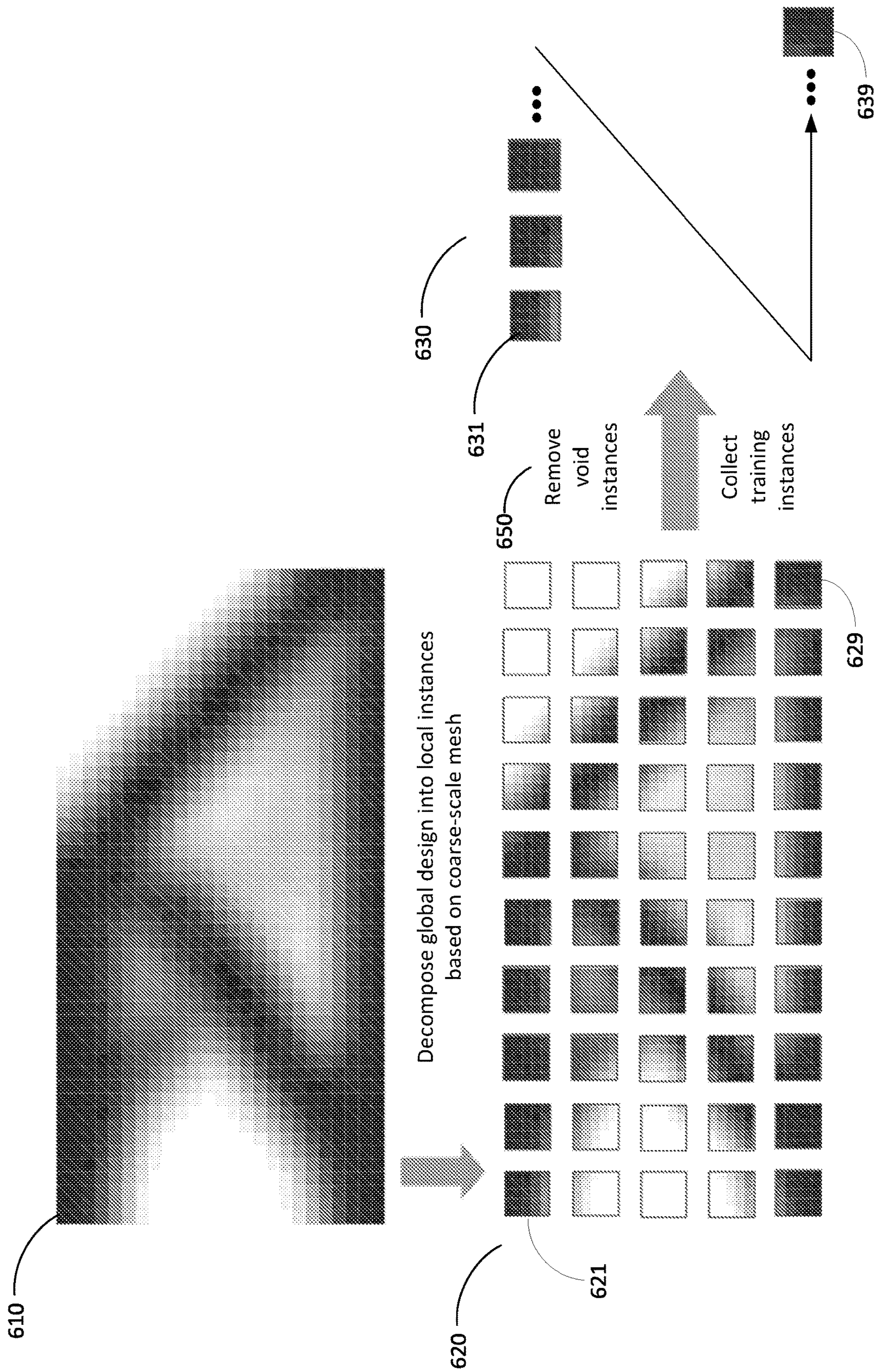
FIG. 6 illustrates a 2D representation of two mesh scales for a cantilever beam design problem.

FIG. 6 illustrates a 2D representation of two mesh scales for a cantilever beam design problem. The localizing training strategy provides advantages compared against a global strategy. The global design of a cantilever beam design consisting of a mesh of fine-scale elements 610 is decomposed into local instances 620. Localized instances are arranged from first coarse-scale instance 621 to last instance 629, and collected as training instances 630, with instance 631 corresponding to element 621, and training instance 639 corresponding to localized instance 629. By localizing the training input data, the total number and diversity of the training samples for the fully-connected DNN is significantly increased. From a machine learning perspective, more diverse training samples can provide more accurate predictions. Also, localizing the training input allows bounding the size as well as memory requirement of the fully-connected DNN for problems of any size. Otherwise, the size of the fully-connected DNN and its associated memory requirement will increase as the size of the problem increases, leading to an unscalable and inefficient machine learning-based model.

With the localized training strategy, a proper constitution of the training data for the machine learning-based model achieves accurate predictions. Each training sample is constructed based on the dependence of sensitivity and the availability of information in the two mesh levels.

In an embodiment, the training data from the fine-scale mesh is the design variables z (or closely-related variables) in each training instance. The filtered design variables $\bar{z}$ may be chosen as the input data from the fine-scale mesh for having smoother distribution than the design variables due to the effect of the density filter P. Accordingly, output data may be chosen to be the sensitivities of the objective function with respect to the filtered design variables $\bar{z}$ within each instance. We denote $\tilde{\bar{G}}$ as a prediction of sensitivity $\bar{G}$ by the machine learning-based model. Once prediction $\tilde{\bar{G}}$ is solved, the prediction for sensitivity G, denoted as $\tilde{G}$, can be efficiently obtained based on Equation (6) as follows:

$$\tilde{G}=P^T \tilde{\bar{G}} \tag{16a}$$

Unlike the fine-scale mesh, the structural responses on the coarse-scale mesh are known at every optimization. Thus, the input training data from the coarse-scale mesh is taken as the state variables on the coarse-scale mesh. Because all the information about the state variables is accessible, including for example, the displacement, strain, and stress fields, one of state variables should be selected as the input training data to the machine learning-based model from the coarse-scale mesh to obtain the most accurate prediction. In an embodiment, the nodal displacement vector ui of each coarse-scale element is selected as the state variable based on Equation (5). Alternatively, the strain vectors at all the integration points of each coarse-scale element may be used as the state variable for training input data. For the kth coarse-scale element, $$\varepsilon_k^C$$

denotes a vector collecting the strain vectors at all the integration points of that element, namely:

$$\varepsilon_k^C = \left[\varepsilon_1^{C,k}, \ldots, \varepsilon_{n_G}^{C,k}\right]^\top, \text{ where } \varepsilon_j^{C,k} = \left[\varepsilon_{xx,j}^{C,k}, \varepsilon_{yy,j}^{C,k}, \varepsilon_{zz,j}^{C,k}, \gamma_{xy,j}^{C,k}, \gamma_{xz,j}^{C,k}, \gamma_{yz,j}^{C,k}\right]^\top$$

is the strain vector obtained at the jth integration point of the kth coarse-scale element. The strain vector $$\varepsilon_k^{C,k}$$

can be computed from the nodal displacement vector $$u_k^C$$

of element k following the standard finite element procedure using the values of the gradients of the shape functions at the jth integration point of that element.

The following is a demonstration of rationale for different predication accuracy obtained by training the DNN with different sets of input data, namely nodal displacement vector $$u_k^C$$

or strain vector $$\varepsilon_k^{C,k}.$$

Recall that Equation (5) that sensitivity $\overline{G}$ is given by:

$$\overline{G}_i = -p(\overline{z}_i)^{p-1}(u_i)^\top K^0 u_i \tag{18}$$

where $K^0$ is the local stiffness associated with solid materials that is identical for each element. Alternatively, sensitivity $\overline{G}$ can be expressed in terms of element-level strain vectors, $$\overline{G}_i = -p(\overline{z}_i)^{p-1}\sum_{j=1}^{n_G}[(\varepsilon_j^i)^\top D^0 \varepsilon_j^i] \tag{19}$$

where $$\varepsilon_j^i$$

is the strain vector at the jth integration point of element i, and $D^0$ is the modulus matrix of the solid material. According to expressions (18) and (19), $\overline{G}$ depends on the nodal displacement vector $u_i$ through a quadratic form determined by matrix $K^0$, while its dependence on the element-level strain vector is a quadratic form determined by matrix $D^0$. When training the DNN, a learning of the coefficients, or equivalently the eigenvalues and their associated eigenvectors, occurs for matrices $K^0$ or $D^0$. With respect to matrix $K^0$, it is a positive semi-definite matrix with six eigenvalues that equal 0 representing the rigid body motions. Therefore, the quadratic form $(u_i)^T K^0 u_i$ in expression (18) may be expressed as:

$$(u_i)^\top K^0 u_i = \sum_{k=1}^{n-6}\lambda_k[(q_k)^\top u_i] + \sum_{k=n-5}^{n} 0[(q_k)^\top u_i] \tag{20}$$

where:

- n is the total number of displacement DOFs in the element;
- $\lambda_1, \ldots, \lambda_{n-6}$ are the positive eigenvalues of $K^0$ with $q_1, \ldots, q_{n-6}$ being their corresponding eigenvectors; and
- $q_{n-5}, \ldots, q_n$ are the eigenvectors associated with the eigenvalues $\lambda_k=0$.

According to the above expressions, due to the presence of eigenvalues that equal zero ($\lambda_k=0$), it is impossible to correctly learn vectors $q_{n-5}, \ldots, q_n$ from the training data. As a result, learning all the coefficients of matrix $K^0$ with on the nodal displacement vector becomes an ill-posed task. Unlike matrix $K^0$, the $D^0$ matrix is strictly positive definite, thus, learning all of its coefficients is a well-posed task.

In an embodiment, training efficiency is improved by removing void training instances 650 when collecting training instances, as shown in FIG. 6. Due to the nature of topology optimization, void training instances are common in the training data. A void training instance is referred to a training sample with all its enclosed filtered design variables being a zero value. In a void training instance, the exact sensitivities of all the design variables should be zero no matter what the input strain vector is. Typically, the void training instances could constitute a large portion of the training data, especially in later stages of topology optimization. However, the information contained therein is quite limited as compared to other training instances which contain non-zero filtered design variables. In an embodiment, a removing strategy includes only a small fraction of randomly selected void instances in the training data and the remainder is discarded. In an aspect, probability parameter $P_k$ is used for the probability of keeping each void instance. For example, if a parameter value is chosen such as $P_k=0.1$, each void training instance has a 10% chance of being included in the training data. This proposed strategy of removing void training instances can greatly improve the efficiency of the training of the machine learning-based model without sacrificing accuracy. In an aspect, keeping a small number of randomly selected void instances in the training data can improve the predication accuracy of the DNN compared to either keeping or removing all the void instances.

Test trials for the integrated framework of topology optimization with machine learning-based models described above demonstrate significant improvement in computational efficiency, particularly as the mesh size increases. The design process is significantly accelerated by selecting larger block size NB for the coarse-scale mesh. For example, with block size NB=15, the solution was achieved six times faster than using a standard finite element analysis topology optimization approach.

Figure 7:
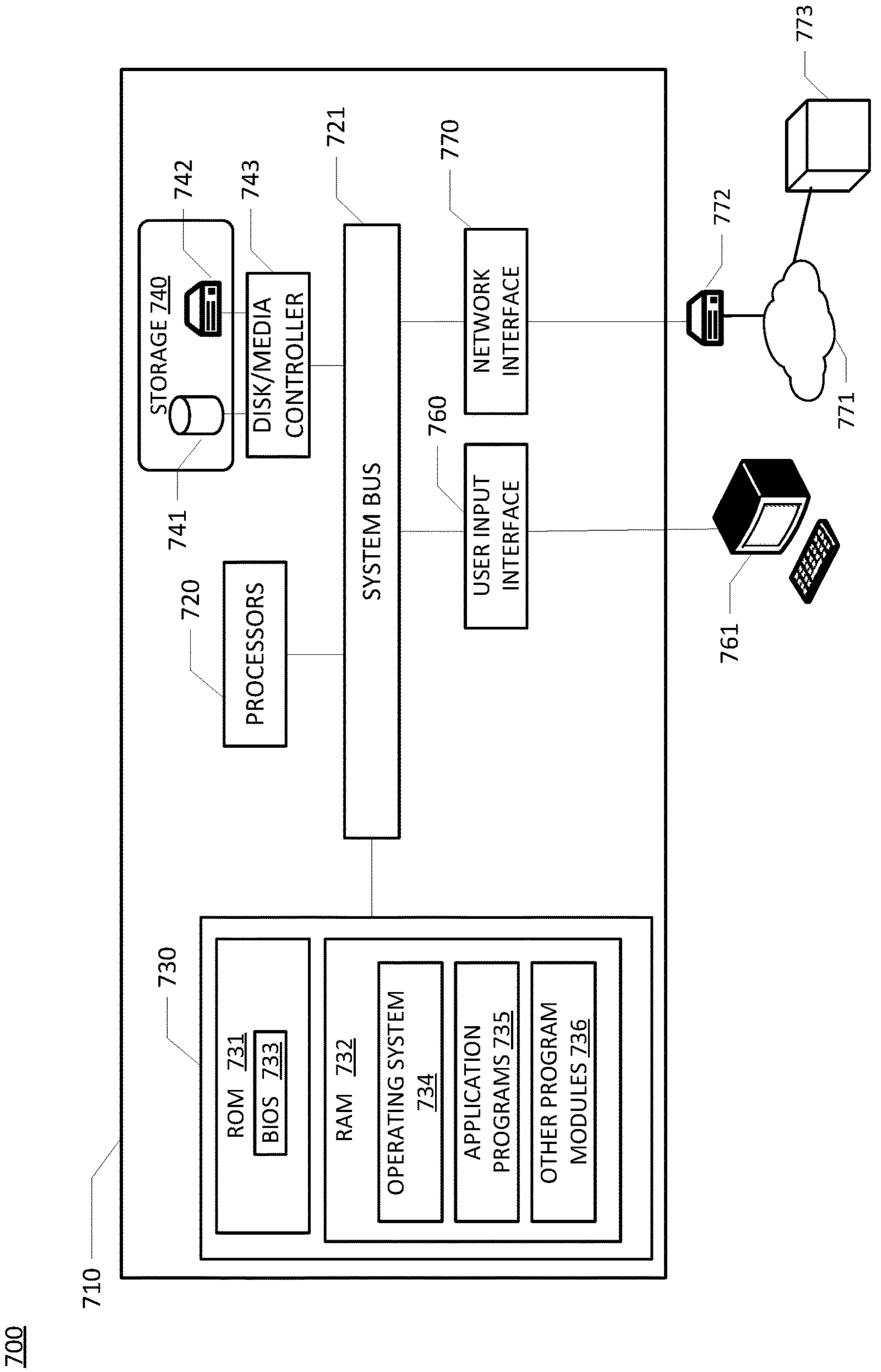
FIG. 7 shows an exemplary computing environment within which embodiments of the disclosure may be implemented.

FIG. 7 illustrates an example of a computing environment within which embodiments of the present disclosure may be implemented. A computing environment 700 includes a computer system 710 that may include a communication mechanism such as a system bus 721 or other communication mechanism for communicating information within the computer system 710. The computer system 710 further includes one or more processors 720 coupled with the system bus 721 for processing the information. In an embodiment, computing environment 700 corresponds to a topology optimization system, in which the computer system 710 relates to a computer described below in greater detail.

The processors 720 may include one or more central processing units (CPUs), graphical processing units (GPUs), or any other processor known in the art. More generally, a processor as described herein is a device for executing machine-readable instructions stored on a computer readable medium, for performing tasks and may comprise any one or combination of, hardware and firmware. A processor may also comprise memory storing machine-readable instructions executable for performing tasks. A processor acts upon information by manipulating, analyzing, modifying, converting or transmitting information for use by an executable procedure or an information device, and/or by routing the information to an output device. A processor may use or comprise the capabilities of a computer, controller or microprocessor, for example, and be conditioned using executable instructions to perform special purpose functions not performed by a general purpose computer. A processor may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 720 may have any suitable microarchitecture design that includes any number of constituent components such as, for example, registers, multiplexers, arithmetic logic units, cache controllers for controlling read/write operations to cache memory, branch predictors, or the like. The micro-architecture design of the processor may be capable of supporting any of a variety of instruction sets. A processor may be coupled (electrically and/or as comprising executable components) with any other processor enabling interaction and/or communication there-between. A user interface processor or generator is a known element comprising electronic circuitry or software or a combination of both for generating display images or portions thereof. A user interface comprises one or more display images enabling user interaction with a processor or other device.

The system bus 721 may include at least one of a system bus, a memory bus, an address bus, or a message bus, and may permit exchange of information (e.g., data (including computer-executable code), signaling, etc.) between various components of the computer system 710. The system bus 721 may include, without limitation, a memory bus or a memory controller, a peripheral bus, an accelerated graphics port, and so forth. The system bus 721 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnects (PCI) architecture, a PCI-Express architecture, a Personal Computer Memory Card International Association (PCMCIA) architecture, a Universal Serial Bus (USB) architecture, and so forth.

Continuing with reference to FIG. 7, the computer system 710 may also include a system memory 730 coupled to the system bus 721 for storing information and instructions to be executed by processors 720. The system memory 730 may include computer readable storage media in the form of volatile and/or nonvolatile memory, such as read only memory (ROM) 731 and/or random access memory (RAM) 732. The RAM 732 may include other dynamic storage device(s) (e.g., dynamic RAM, static RAM, and synchronous DRAM). The ROM 731 may include other static storage device(s) (e.g., programmable ROM, erasable PROM, and electrically erasable PROM). In addition, the system memory 730 may be used for storing temporary variables or other intermediate information during the execution of instructions by the processors 720. A basic input/output system 733 (BIOS) containing the basic routines that help to transfer information between elements within computer system 710, such as during start-up, may be stored in the ROM 731. RAM 732 may contain data and/or program modules that are immediately accessible to and/or presently being operated on by the processors 720. System memory 730 may additionally include, for example, operating system 734, application modules 735, and other program modules 736. Application modules 735 may include aforementioned modules described for FIG. 1 and may also include a user portal for development of the application program, allowing input parameters to be entered and modified as necessary.

The operating system 734 may be loaded into the memory 730 and may provide an interface between other application software executing on the computer system 710 and hardware resources of the computer system 710. More specifically, the operating system 734 may include a set of computer-executable instructions for managing hardware resources of the computer system 710 and for providing common services to other application programs (e.g., managing memory allocation among various application programs). In certain example embodiments, the operating system 734 may control execution of one or more of the program modules depicted as being stored in the data storage 740. The operating system 734 may include any operating system now known or which may be developed in the future including, but not limited to, any server operating system, any mainframe operating system, or any other proprietary or non-proprietary operating system.

The computer system 710 may also include a disk/media controller 743 coupled to the system bus 721 to control one or more storage devices for storing information and instructions, such as a magnetic hard disk 741 and/or a removable media drive 742 (e.g., floppy disk drive, compact disc drive, tape drive, flash drive, and/or solid state drive). Storage devices 740 may be added to the computer system 710 using an appropriate device interface (e.g., a small computer system interface (SCSI), integrated device electronics (IDE), Universal Serial Bus (USB), or FireWire). Storage devices 741, 742 may be external to the computer system 710.

The computer system 710 may include a user input interface or graphical user interface (GUI) 761, which may comprise one or more input devices, such as a keyboard, touchscreen, tablet and/or a pointing device, for interacting with a computer user and providing information to the processors 720.

The computer system 710 may perform a portion or all of the processing steps of embodiments of the invention in response to the processors 720 executing one or more sequences of one or more instructions contained in a memory, such as the system memory 730. Such instructions may be read into the system memory 730 from another computer readable medium of storage 740, such as the magnetic hard disk 741 or the removable media drive 742. The magnetic hard disk 741 and/or removable media drive 742 may contain one or more data stores and data files used by embodiments of the present disclosure. The data store 740 may include, but are not limited to, databases (e.g., relational, object-oriented, etc.), file systems, flat files, distributed data stores in which data is stored on more than one node of a computer network, peer-to-peer network data stores, or the like. Data store contents and data files may be encrypted to improve security. The processors 720 may also be employed in a multi-processing arrangement to execute the one or more sequences of instructions contained in system memory 730. In alternative embodiments, hard-wired circuitry may be used in place of or in combination with software instructions. Thus, embodiments are not limited to any specific combination of hardware circuitry and software.

As stated above, the computer system 710 may include at least one computer readable medium or memory for holding instructions programmed according to embodiments of the invention and for containing data structures, tables, records, or other data described herein. The term "computer readable medium" as used herein refers to any medium that participates in providing instructions to the processors 720 for execution. A computer readable medium may take many forms including, but not limited to, non-transitory, non-volatile media, volatile media, and transmission media. Non-limiting examples of non-volatile media include optical disks, solid state drives, magnetic disks, and magneto-optical disks, such as magnetic hard disk 741 or removable media drive 742. Non-limiting examples of volatile media include dynamic memory, such as system memory 730. Non-limiting examples of transmission media include coaxial cables, copper wire, and fiber optics, including the wires that make up the system bus 721. Transmission media may also take the form of acoustic or light waves, such as those generated during radio wave and infrared data communications.

Computer readable medium instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to illustrations of methods, apparatus (systems), and computer program products according to embodiments of the disclosure. It will be understood that each block of the illustrations, and combinations of blocks in the illustrations, may be implemented by computer readable medium instructions.

The computing environment 700 may further include the computer system 710 operating in a networked environment using logical connections to one or more remote computers, such as remote computing device 773. The network interface 770 may enable communication, for example, with other remote devices 773 or systems and/or the storage devices 741, 742 via the network 771. Remote computing device 773 may be a personal computer (laptop or desktop), a mobile device, a server, a router, a network PC, a peer device or other common network node, and typically includes many or all of the elements described above relative to computer system 710. When used in a networking environment, computer system 710 may include modem 772 for establishing communications over a network 771, such as the Internet. Modem 772 may be connected to system bus 721 via user network interface 770, or via another appropriate mechanism.

Network 771 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 710 and other computers (e.g., remote computing device 773). The network 771 may be wired, wireless or a combination thereof wired connections may be implemented using Ethernet, Universal Serial Bus (USB), RJ-6, or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 771.

It should be appreciated that the program modules, applications, computer-executable instructions, code, or the like depicted in FIG. 7 as being stored in the system memory 730 are merely illustrative and not exhaustive and that processing described as being supported by any particular module may alternatively be distributed across multiple modules or performed by a different module. In addition, various program module(s), script(s), plug-in(s), Application Programming Interface(s) (API(s)), or any other suitable computer-executable code hosted locally on the computer system 710, the remote device 773, and/or hosted on other computing device(s) accessible via one or more of the network(s) 771, may be provided to support functionality provided by the program modules, applications, or computer-executable code depicted in FIG. 7 and/or additional or alternate functionality. Further, functionality may be modularized differently such that processing described as being supported collectively by the collection of program modules depicted in FIG. 7 may be performed by a fewer or greater number of modules, or functionality described as being supported by any particular module may be supported, at least in part, by another module. In addition, program modules that support the functionality described herein may form part of one or more applications executable across any number of systems or devices in accordance with any suitable computing model such as, for example, a client-server model, a peer-to-peer model, and so forth. In addition, any of the functionality described as being supported by any of the program modules depicted in FIG. 7 may be implemented, at least partially, in hardware and/or firmware across any number of devices.

It should further be appreciated that the computer system 710 may include alternate and/or additional hardware, software, or firmware components beyond those described or depicted without departing from the scope of the disclosure. More particularly, it should be appreciated that software, firmware, or hardware components depicted as forming part of the computer system 710 are merely illustrative and that some components may not be present or additional components may be provided in various embodiments. While various illustrative program modules have been depicted and described as software modules stored in system memory 730, it should be appreciated that functionality described as being supported by the program modules may be enabled by any combination of hardware, software, and/or firmware. It should further be appreciated that each of the above-mentioned modules may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other modules. Further, one or more depicted modules may not be present in certain embodiments, while in other embodiments, additional modules not depicted may be present and may support at least a portion of the described functionality and/or additional functionality. Moreover, while certain modules may be depicted and described as sub-modules of another module, in certain embodiments, such modules may be provided as independent modules or as sub-modules of other modules.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure. In addition, it should be appreciated that any operation, element, component, data, or the like described herein as being based on another operation, element, component, data, or the like can be additionally based on one or more other operations, elements, components, data, or the like. Accordingly, the phrase "based on," or variants thereof, should be interpreted as "based at least in part on."

The block diagrams in the Figures illustrate the architecture, functionality, and operation of possible implementations of systems, methods, and computer program products according to various embodiments of the present disclosure. In this regard, each block in the block diagrams may represent a module, segment, or portion of instructions, which comprises one or more executable instructions for implementing the specified logical function(s). In some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams illustration, and combinations of blocks in the block diagrams illustration, can be implemented by special purpose hardware-based systems that perform the specified functions or acts or carry out combinations of special purpose hardware and computer instructions.

What is claimed is:

1. A system for accelerating topology optimization of a design of an additive manufacturable cantilever beam, the system comprising:

a memory having a plurality of modules stored thereon; and a processor for executing the modules, the modules comprising:

a topology optimization module configured to compute state variables of the topology using a two-scale topology optimization for a number of optimization steps using design variables mapped to a fine-scale mesh and the state variables mapped to a coarse-scale mesh, wherein the state variables are computed using finite element analysis based on a simulated load and boundary conditions on the objective design and are accumulated with corresponding design variables as history data;

a machine learning module comprising a machine learning-based model having a tunable number of hidden layers configured to:

execute an initial training of the machine learning-based model using the history data for a first number of optimization steps ($W_I$);

determine a predicted sensitivity value related to the design variables using the trained machine learning-based model for each of a second number of optimization steps ($N_F$);

execute an online update of the machine learning-based model using updated history data for a third number of optimization steps ($W_U$);

update the design variables based on the predicted sensitivity value for each optimization step; and recursively repeat the optimization steps until the updated design variables are within a tolerance of prior updated design variables so as to find a structural topology that has the most stiffness under a prescribed load and boundary conditions of the design of the additive manufacturable cantilever beam part;

wherein the topology optimization module executes the two-scale optimization only prior to and during the first number of optimization steps ($W_I$) that generate the history data for the initial training of the machine learning-based model and during optimization steps for a duration of the third number of steps ($W_U$) initiated periodically at an update frequency equal to the second number of optimization steps ($N_F$) for generating the updated history data.

2. The system of claim 1, the modules further comprising:

a fine-scale mapping module configured to define the fine-scale mesh using hexahedral elements to represent an objective topology of the design; and a course-scale mapping module configured to define the course-scale mesh of the hexahedral elements, wherein the fine-scale mesh is completely embedded in the course-scale mesh.

3. The system of claim 2, wherein design variables on the fine-scale mesh are updated every optimization step and state variables are computed on the fine-scale mesh only when collecting history data for training the machine learning-based model.

4. The system of claim 1, wherein the topology optimization module is further configured to filter the design variables using a filter matrix (P) for smoothing the distribution.

5. The system of claim 1, wherein the state variables include at least one of:

displacement of coarse-scale mesh elements,
strain on coarse-scale mesh elements, and
stress on coarse-scale mesh elements.

6. The system of claim 1, wherein the state variables are computed using strain vectors at all integration Gauss points of each coarse-scale mesh element.

7. A method for accelerating topology optimization of a design of an additive manufacturable cantilever beam, comprising:

computing state variables of the topology using a two-scale topology optimization for a number of optimization steps using design variables mapped to a fine-scale mesh and the state variables mapped to a coarse-scale mesh, wherein the state variables are computed using finite element analysis based on a simulated load and boundary conditions on the objective design and are accumulated with corresponding design variables as history data;

executing an initial training of a machine learning-based model using the history data for a first number of optimization steps ($W_I$);

determining a predicted sensitivity value related to the design variables using the trained machine learning-based model for each of a second number of optimization steps ($N_F$);

executing an online update of the machine learning-based model using updated history data for a third number of optimization steps ($W_U$);

updating the design variables based on the predicted sensitivity value for each optimization step; and recursively repeating the optimization steps until the updated design variables are within a tolerance of prior updated design variables so as to find a structural topology that has the most stiffness under a prescribed load and boundary conditions of the design of the additive manufacturable cantilever beam;

wherein the two-scale optimization is executed only prior to and during the first number of optimization steps ($W_I$) that generate the history data for the initial training of the machine learning-based model and during optimization steps for a duration of the third number of steps ($W_U$) initiated periodically at an update frequency equal to the second number of optimization steps ($N_F$) for generating the updated history data.

8. The method of claim 7, further comprising defining the fine-scale mesh using hexahedral elements to represent an objective topology of the design;

wherein the fine-scale mesh is completely embedded in the course-scale mesh.

9. The method of claim 7, wherein design variables on the fine-scale mesh are updated every optimization step and state variables are computed on the fine-scale mesh only when collecting history data for training the machine learning-based model.

10. The method of claim 7, further comprising filtering the design variables using a filter matrix (P) for smoothing the distribution.

11. The method of claim 10, wherein the state variables include at least one of:

displacement of coarse-scale mesh elements, strain on coarse-scale mesh elements, and stress on coarse-scale mesh elements.

12. The method of claim 7, wherein the state variables are computed using strain vectors at all integration Gauss points of each coarse-scale mesh element.

13. The system of claim 1, wherein the sensitivity values are predicted based on a current design without solving state equations.

14. The method of claim 7, wherein the sensitivity values are predicted based on a current design without solving state equations.

* * * * *